United States Patent [19]

Itoh

[11] Patent Number: 4,996,079
[45] Date of Patent: Feb. 26, 1991

[54] METHOD OF DEPOSITING THIN FILMS CONSISTING MAINLY OF CARBON

[75] Inventor: Kenji Itoh, Zama, Japan

[73] Assignee: Semiconductor Energy Laboratory Co., Ltd., Kanagawa, Japan

[21] Appl. No.: 311,845

[22] Filed: Feb. 17, 1989

[30] Foreign Application Priority Data

Feb. 26, 1988 [JP] Japan .................................. 63-43414
Mar. 2, 1988 [JP] Japan .................................. 63-50397

[51] Int. Cl.⁵ ........................ B05D 5/12; C23C 16/26; C23C 16/50
[52] U.S. Cl. ........................................ 427/39; 427/38; 427/249
[58] Field of Search ........................ 427/38, 39, 249; 428/408, 217

[56] References Cited

U.S. PATENT DOCUMENTS

| 4,698,256 | 10/1987 | Giglia et al. | 428/408 |
| 4,770,940 | 9/1988 | Ovshinsky et al. | 428/408 |
| 4,777,090 | 10/1988 | Ovshinsky et al. | 427/45.1 |

FOREIGN PATENT DOCUMENTS 61-067767  4/1986  Japan .................................... 427/38

Primary Examiner—Norman Morgenstern
Assistant Examiner—Margaret Bueker
Attorney, Agent, or Firm—Sixbey, Friedman, Leedom & Ferguson

[57] ABSTRACT

While CVD (chemical vopour reaction) methods and enhanced CVD methods for coating a substrate with a carbon coating have recently been attracting considerable interest, there have occurred hitherto rubbing-off of the carbon coating from the underlying substrate due to differential thermal expansion or contraction. The present invention discloses a modification of the conventional CVD process for carbon deposition in accordance with which the deposition condition is changed in order that the hardness of the carbon coating at the interface between the coating and the underlying substrate is lower than that at the external surface of the coating.

10 Claims, 6 Drawing Sheets (A)

(B)

METHOD OF DEPOSITING THIN FILMS CONSISTING MAINLY OF CARBON

BACKGROUND OF THE INVENTION

This invention relates to a method of depositing thin films consisting mainly of carbon.

Carbon thin films are very suitable for making surfaces abrasion-proof, smooth, or highly thermal conductive. Such a carbon film is deposited by use of chemical vapour reaction. A plasma state is caused from a reactive gas by applying high frequency electric energy between a pair of electrodes between which the deposition space is defined. In the deposition space, a hydrocarbon gas and a carrier of hydrogen are excited into plasma gas, and a carbon film is deposited on a surface. During the deposition, positive ions such as hydrogen ions are drifted toward the surface by a self-bias voltage between the pair of electrodes and sputters the depositing film. The sputtering functions to reduce the formation of the carbon bonds based on the sp and $sp^2$ orbitals and to increase the proportion of the carbon bonds based on the $sp^3$ orbital, and thereby the carbon film tends to grow in diamond structure.

There are two methods for increasing the bias voltage built between the pair of electrodes. One method is to decrease the pressure of the reactive gas in the deposition space. The relative energy given to the reactive gas is increased in proportion to the decrease of the reactive gas in the reaction chamber. The molar ratio of ions to non-ions increases as the pressure decreases. The ions tend to linger about the electrodes and produce a self-bias therebetween. The other method is to increase the input power of the high frequency power and directly increase the number of positive ions.

The sputtering, however, tends to give damage to the surface to be coated, and degrades the property of the interface between the surface and the film. In addition to this, the high degree of hardness itself inherently incurs a disadvantage. Because of the hardness, when expansion or contraction takes place due, e.g. to temperature change, the interface can not bear the tension caused by the differential expansion or contraction ratio between the film and the underlying surface, and eventually the film comes off from the surface.

SUMMARY OF THE INVENTION

It is therefore an object of the invention to provide an excellent carbon deposition method which can be carried out without causing damage to the underlying substrate.

It is another object of the present invention to provide a method for depositing excellent carbon coatings having a high degree of hardness at its external surface and a high adhesivity to the underlying substrate.

In order to accomplish the above and other objects the present invention proposes that carbon deposition on a substrate is carried out initially under the condition for depositing carbon product having a relatively low hardness and finally under the condition for depositing carbon product having a high degree of hardness.

According to a preferred embodiment of the present invention, the energy band gap of carbon product is not lower than 1.0 eV, preferably 1.5 to 5.5 eV: the Vickers hardness is not lower than 2000 $Kg/mm^2$, preferably not lower than 4500 $Kg/mm^2$ at the external surface of carbon coatings: and the thermal condutivity of the product is not lower than 2.5 W/cm deg, preferably 4.0 to 6.0 W/cm deg. When used for thermal heads which are frequently subjected to rubbing action, the smooth and hard surface of the carbon film is very suitable. When used in integrated circuits or semiconductor devices, the high thermal conductivity of the carbon film assists the dissipation of heat generated in the integrated circuit or semiconductor device and prevents the temperature from rising beyond an intolerable level.

DETAILED DESCRIPTION OF THE PREFERRED EMBODIMENTS

Figure 1:
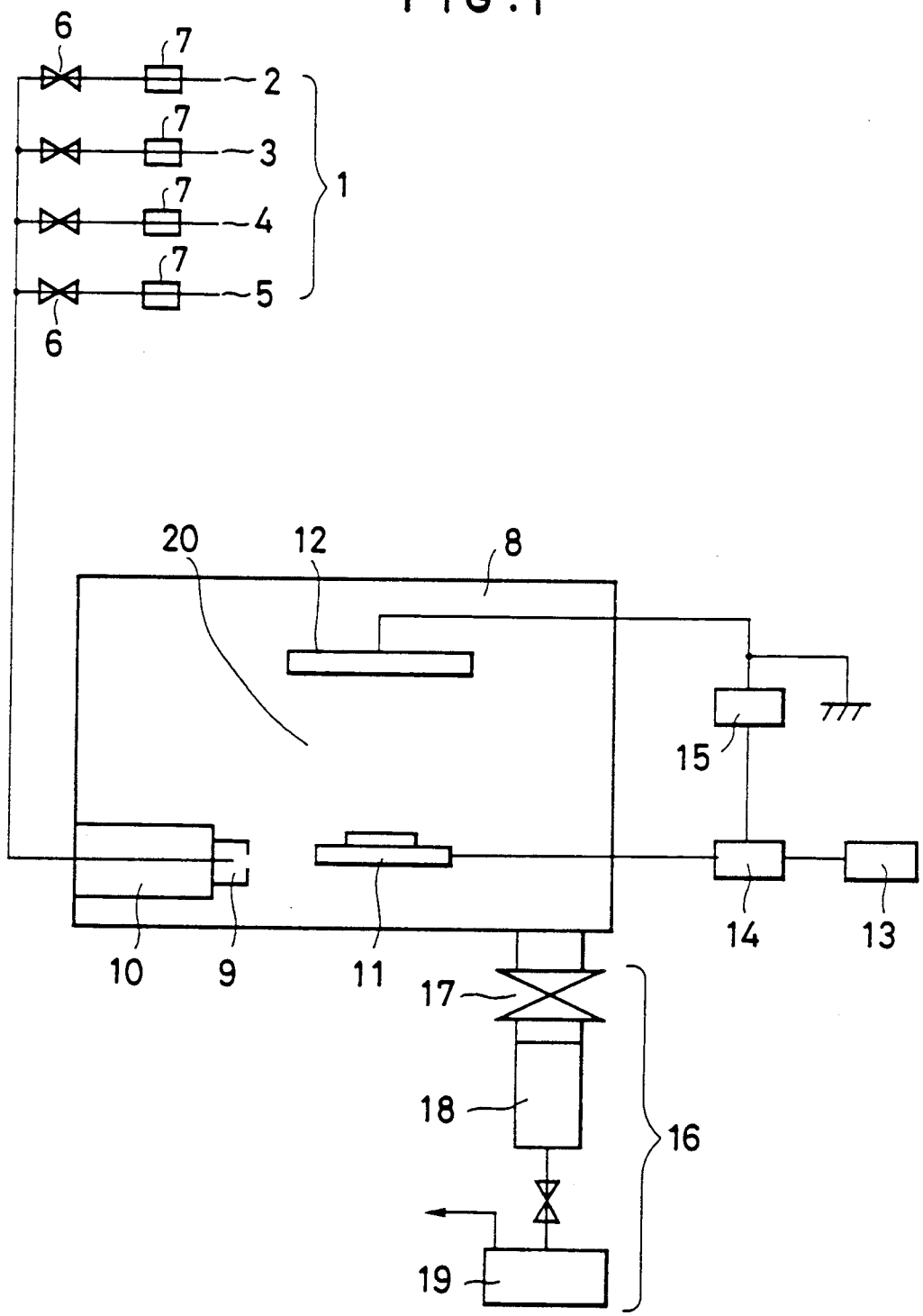
FIG. 1 is a schematic diagram showing a CVD apparatus in accordance with the present invention.

Referring to FIG. 1, there in shown therein a plasma CVD apparatus for depositing carbon material on a surface in accordance with the teaching of the present invention. The surface to be coated may for example be made of semiconductor, glass, metal, ceramics, organic resins, magnetic substance and so forth.

The apparatus comprises a reaction chamber 8 defining a reaction space 20 therein, first and second electrodes 11 and 12, a high frequency electric power source 13 for supplying electric power through a matching transformer 14, a DC bias source 15 connected in series between the electrodes 11 and 12, a gas feeding system 1 consisting of four passages each of which is provided with a flow meter 7 and a valve 6, a microwave energy supply 10 for exciting gases from the feeding system 1, a nozzle 9 through which gas excited by the microwave energy supply 10 is introduced into the reaction space 20, and an exhaust system 16 including a pressure control valve 17, a turbomolecular pump 18 and a rotary pump 19. The electrodes are designed such that (the area of the first electrode 11)/(the area of the second electrode 12)<1.

In operation of this apparatus, a carrier gas of hydrogen is introduced to the reaction space 20 from the gas feeding passage 2 as well as a reactive gas of a hydrocarbon such as methane or ethylene from the gas feeding passage 3. The gas introduction rates of hydrogen and the hydrocarbon are equal. In addition to this, a V-Group dopant gas such as $NH_3$ or $PH_3$, or a III-Group dopant gas may be inputted to the reaction space 20 through the gas feeding passage 4 or 5 in order to form impurity semiconductors. Pre-excitation may be effected by the microwave energy supply 10. The pressure in the reaction space is maintained within the range between 0.001 to 10 Torr, preferably 0.01 to 0.5 Torr. High frequency electric energy at a frequency not lower than 1 GHz, preferably 2.45 GHz, is applied to the reactive gas at 0.1 to 5 kilo Watt for breaking C—H bonds. When the frequency is selected to be 0.1 to 50 MHz, C=C bonds can be broken and transformed to —C—C— bonds. By virtue of this reaction, carbon atoms are deposited atoms in the form of a structure in which the diamond structure occurs at least locally.

A bias voltage of, for example, $-200$ to 600 V is set at the DC bias source 15. The effective bias voltage level is substantially $-400$ to $+400$ V when a self bias level of $-200$ V is spontaneously applied between the electrodes 11 and 12 with the bias voltage level of the source 15 being zero.

Generally, the high frequency input power is chosen between 10 Watt and 5 kilo Watt, preferably between 50 Watt and 1 kilo Watt. This input power corresponds to 0.03 to 3 Watt/cm$^2$ in terms of plasma energy.

Figure 2:
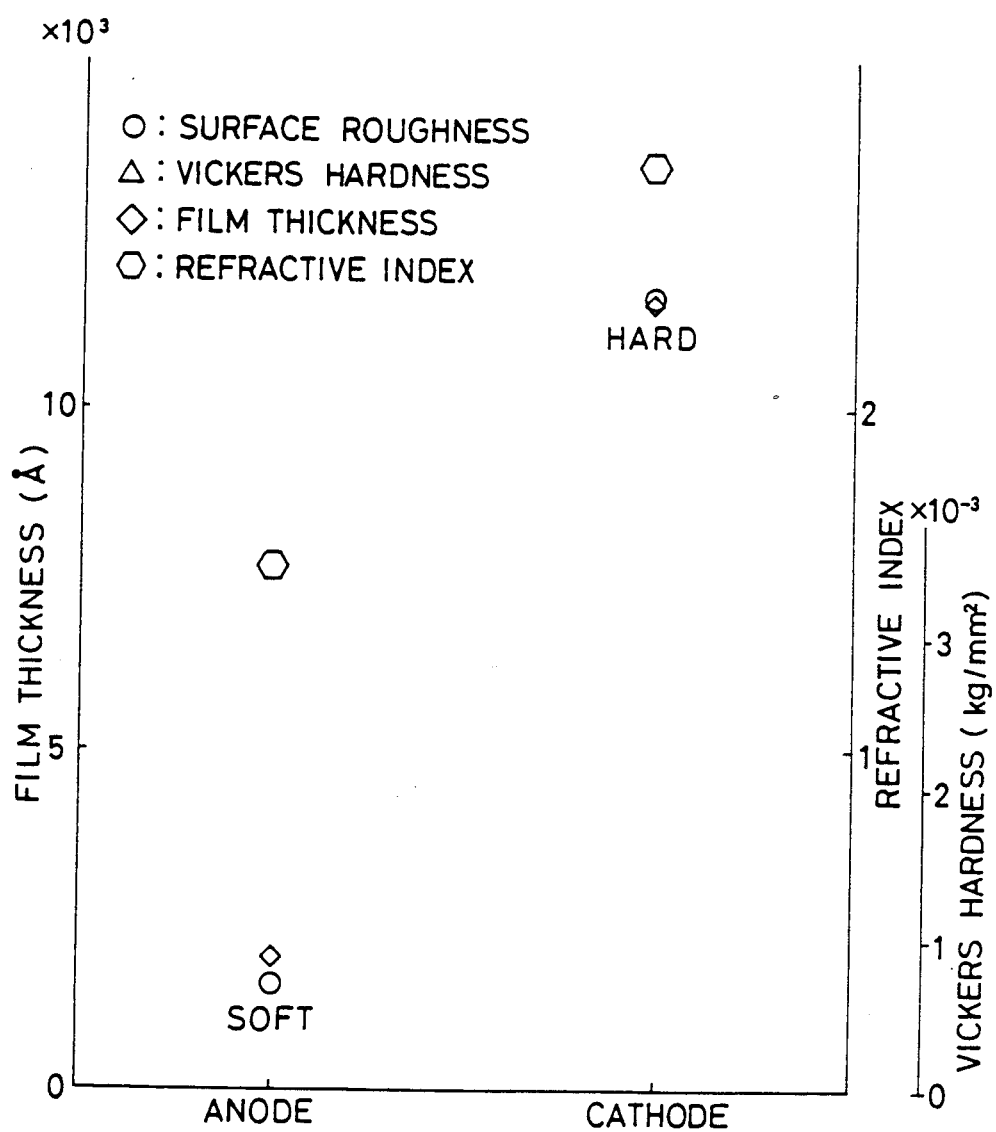
FIG. 2 is a graphical diagram showing the differences between the properties of a carbon product deposited on a substrate functioning as an anode and a carbon product deposited on a substrate functioning as a cathode.

Films were deposited under the deposition condition in which the substrates was used as the anode and under the condition in which the substrate was used as the cathode was made. The deposition conditions were 60 W (high frequency input power), 0.015 Torr (pressure in the deposition space), 100SCCM (introduction speed of methane (or hydrogen)), room temperature (substrate temperature) and 180 min (deposition time). In FIG. 2, circles, triangles, rhombuses and hexagons indicate, respectively, surface roughnesses measured by a needle-contact type tester, Vickers hardnesses measured by a hardness meter, film thicknesses and refractive indice both measured by an elipsometer, of films deposited under the two conditions.

Figure 3:
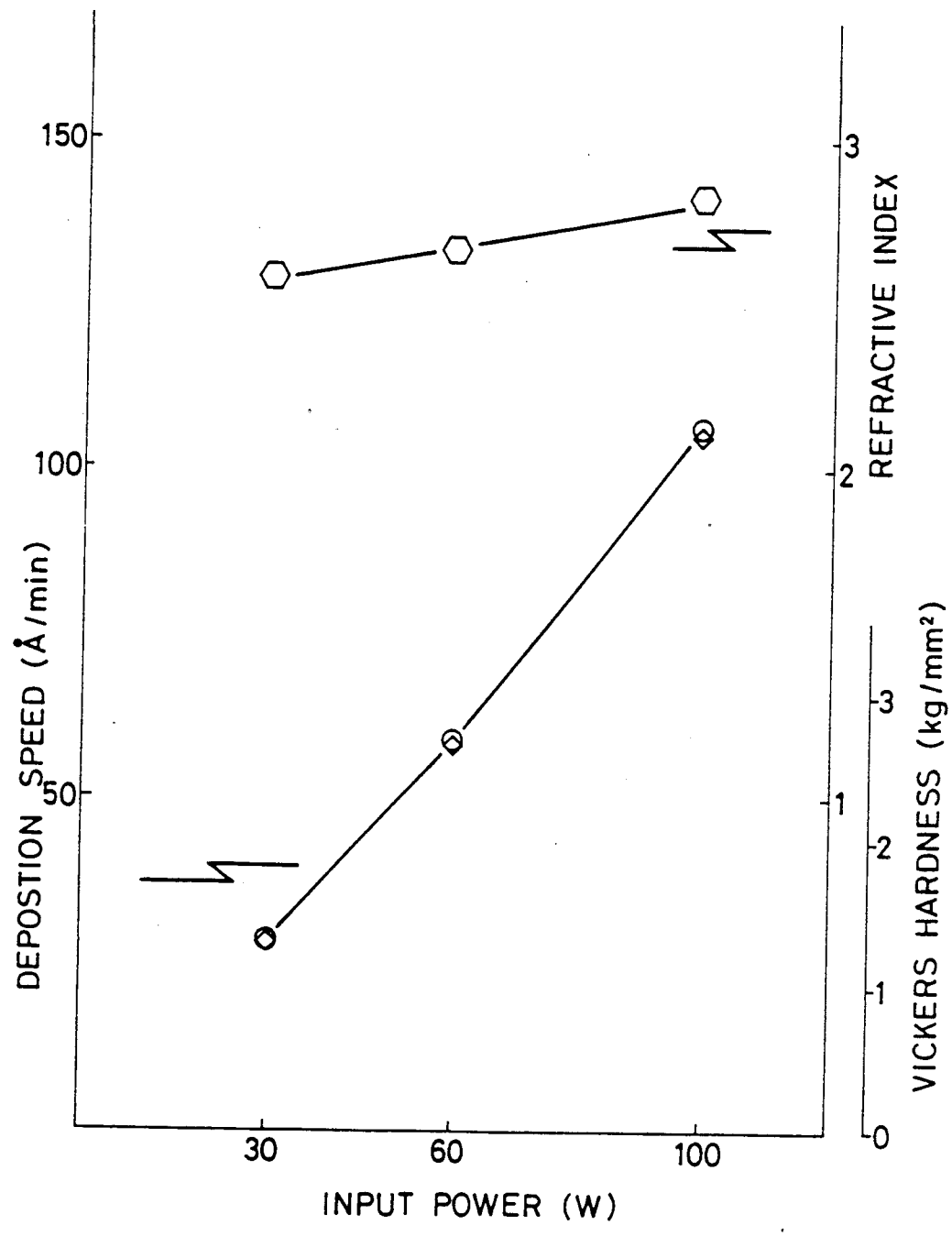
FIG. 3 is a graphical diagram showing the relation between the input power of high frequency electric energy and the properties of deposited films in accordance with the present invention.
Figure 4:
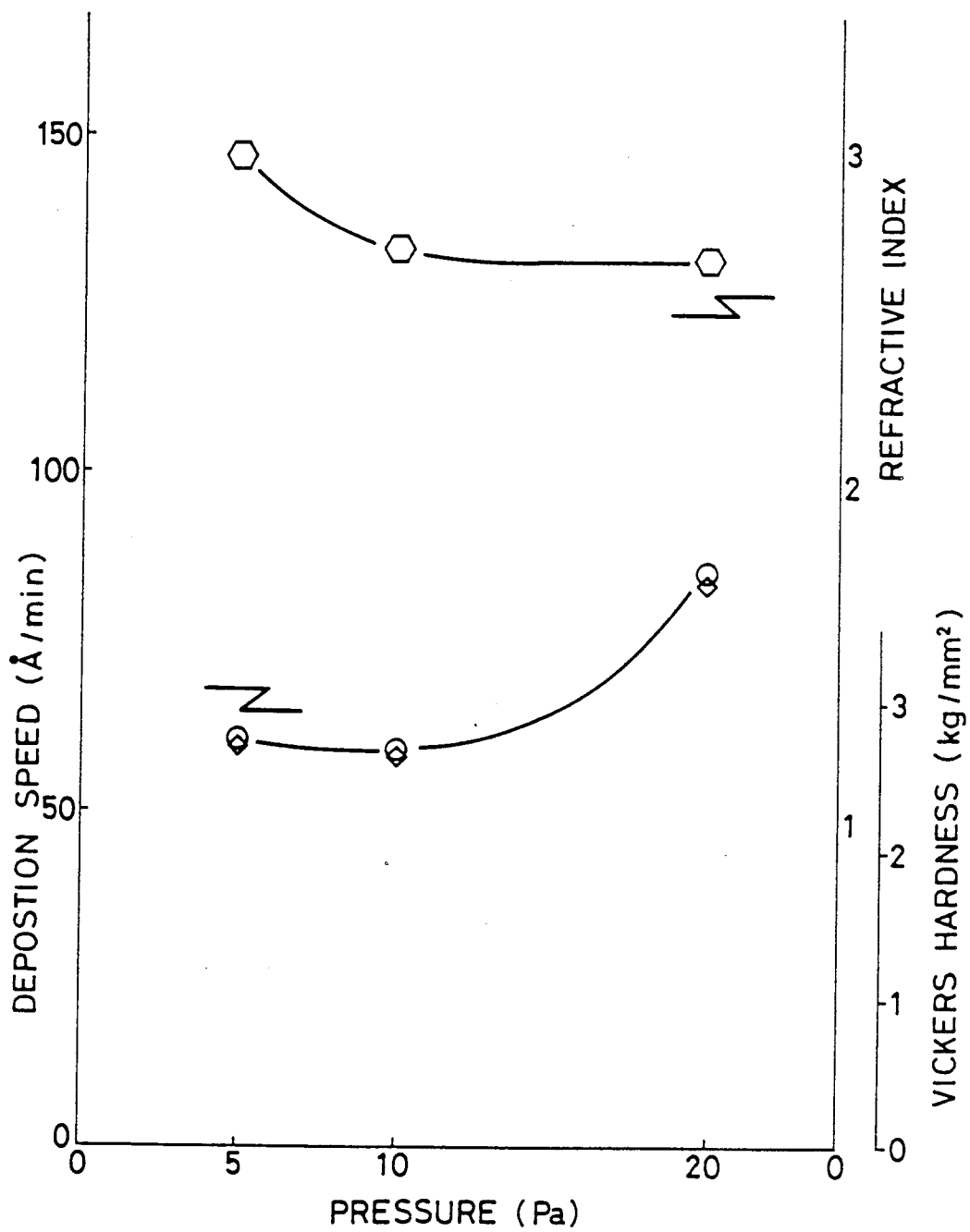
FIG. 4 is a graphical diagram showing the relation between the pressure of reactive gas and the properties of deposited films in accordance with the present invention.
Figure 5:
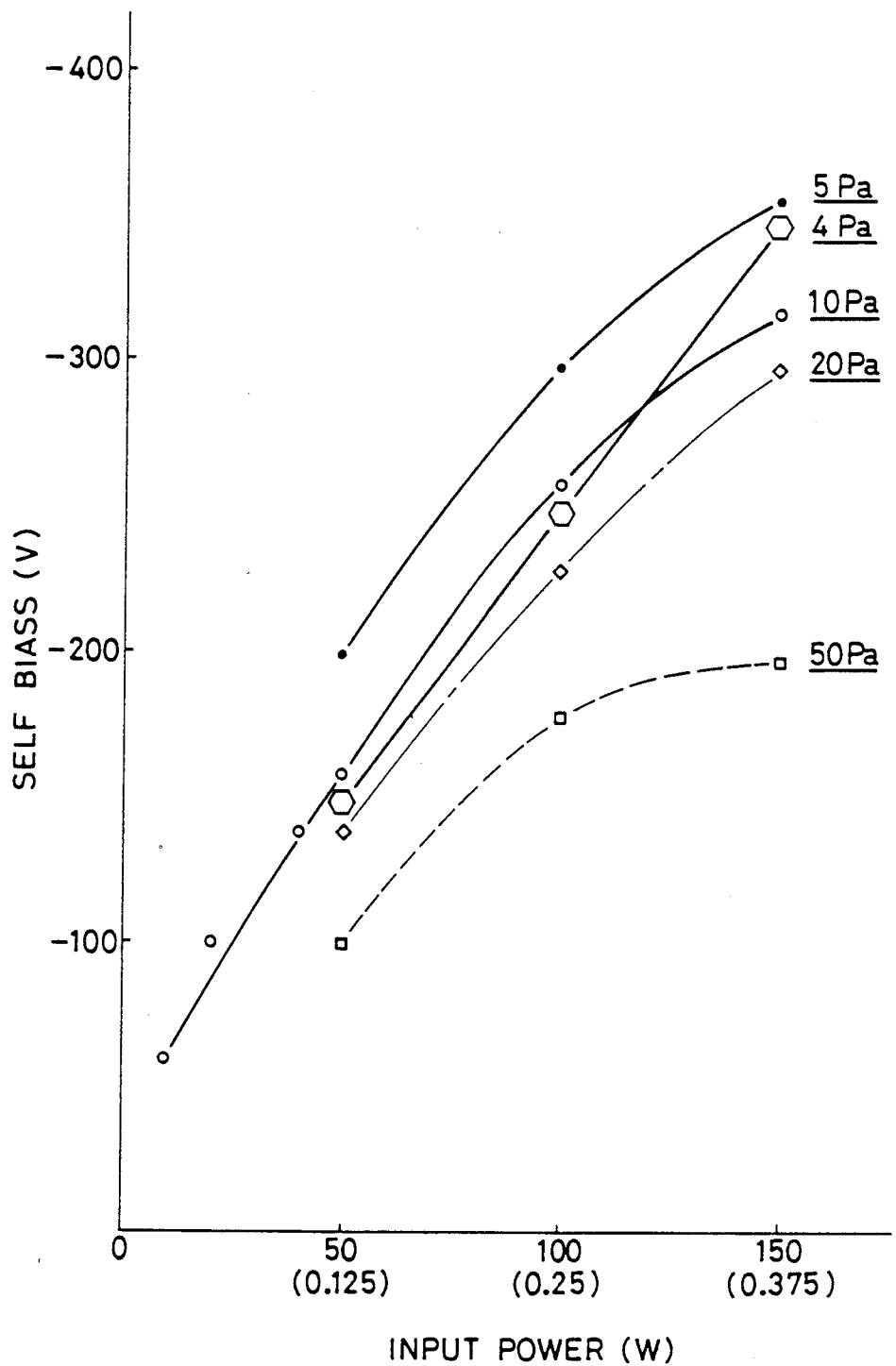
FIG. 5 is a graphical diagram showing the relation between self-bias voltage level and the input power of high frequency electric energy and the pressure of reactive gas in accordance with the present invention.

FIG. 3 shows deposition speeds and Vickers hardnesses of films deposited by inputting high frequency electric energy at various power levels. As can be seen from the figure, a harder film was deposited by inputting higher power energy. FIG. 4 shows deposition speeds and Vickers hardnesses of films deposited in the reaction space at various pressure levels. A harder film was deposited at a lower pressure. In FIGS. 3 and 4, similar symbols are used to indicate similar characteristics as used in FIG. 2. FIG. 5 shows the relations between the pressure in the reaction space and the input power and the self-bias voltage between the electrodes. The figures in parenthesis are equivalent power densities (W/cm$^2$). It can be clearly seen that the higher the input power level of the high frequency power is or the lower the pressure of the reaction space is, the stronger the negative self-bias is applied to the electrodes. The symbols used in FIG. 5 are not in agreement with those used in FIGS. 2, 3 and 4. Comparing FIGS. 2 to 5, it will be understood that a higher degree of Vickers hardness can be obtained by increasing the input power level or decreasing the pressure of the reaction space.

Figure 6:
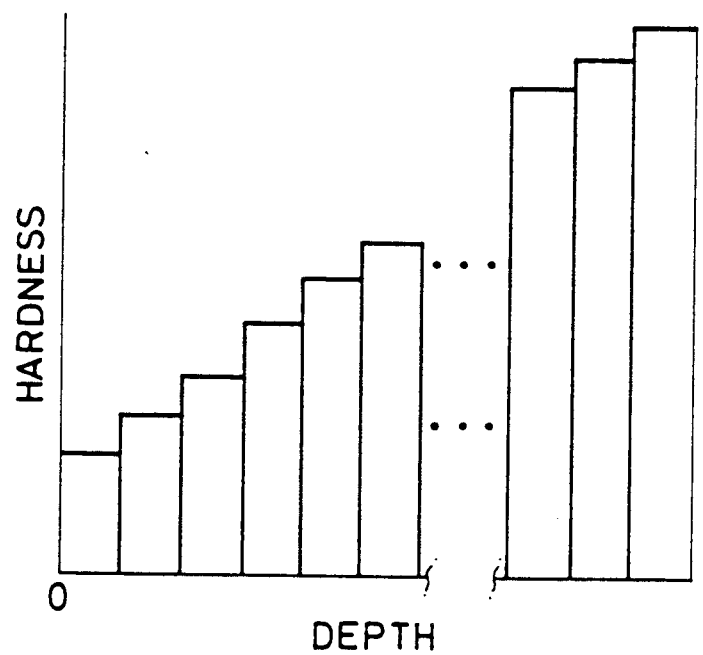
FIGS. 6(A) and 6(B) are a graphical diagram showing the variation of the hardness of the film through the depth thereof in accordance with the present invention.
Figure 6:
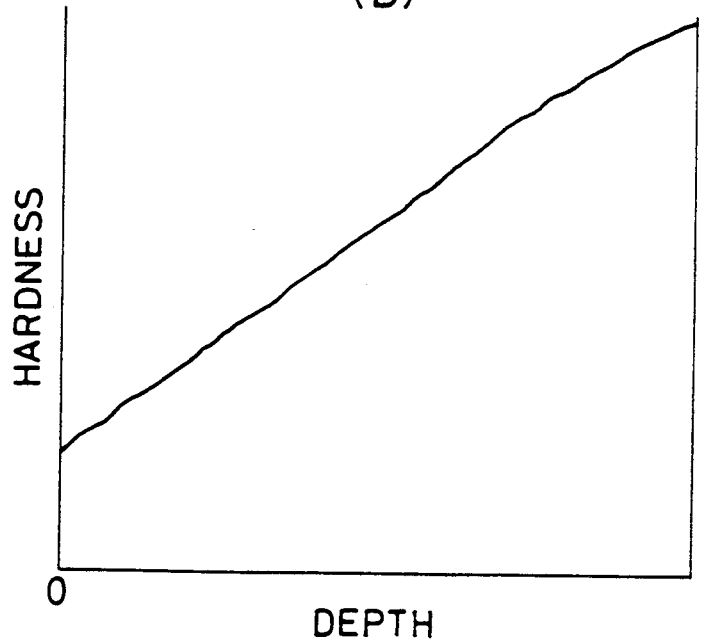

In accordance with the teaching of the present invention, a substrate is coated with a carbon coating while the deposition condition is changed in order that the hardness of the carbon initially deposited on the substrate is relatively low and the hardness of the carbon finally deposited becomes very high in order to provide a hard external surface. This procedure can be carried out in two ways. As seen from FIG. 6(A), the hardness may be changed in steps by stepwise change of the deposition condition in accordance with the above description. Alternatively, as seen from FIG. 6(B), the hardness may be changed continuously from the inner surface to the external surface of the carbon coating.

Experiment 1

Carbon films were deposited on a silicon substrate under various deposition conditions. A first film was deposited on the substrate at a pressure of 0.3 Torr, an input power of 50 W and room temperature (substrate temperature). The deposition time was 150 min. In this condition, the self-bias voltage was $-200$ V. The Vickers hardness was measured to be 2200 Kg/cm$^2$. A second film was deposited on the first film at 0.3 Torr, 100 W and 150° C. The deposition time was 150 min. In this condition, the self-bias voltage was $-150$ V. The Vickers hardness was measured to be 3500 Kg/cm$^2$. Furthermore, a thrid carbon film was deposited on the second film at 0.015 Torr, 2000 W and room temperature. The deposition time was 60 min. The self-bias voltage was $-280$ V. The vickers hardness was measured to be 4200 Kg/mm$^2$. The other deposition conditions were same as described in the above description.

Experiment 2

Carbon deposition was carried out for 150 minutes by introducing methane at 100 SCCM together with hydrogen in order to form a first carbon film. The pressure of the reaction space was 0.03 Torr. The input power was 50 W. The other deposition conditions were same as those of the first film of Experiment 1. A second carbon film was deposited on the first film in the same manner except for the input power of 150 W. Also, a third carbon film was deposited on the second film in the same manner except for the input power being 300 W and the deposition time being 60 minutes. As a result, a laminate carbon film was formed whose Vickers hardness was 2200 Kg/mm$^2$ just adjacent to the underlying silicon substrate, 3500 Kg/mm$^2$ at an intermediate depth and 5000 Kg/mm$^2$ at the external surface.

Experiment 3

This was carried out in order to form a carbon film whose hardness varies across its thickness. Carbon deposition was started under the deposition condition as specified above for the first film of Experiment 1. Thereafter, the input power was gradually increased to 300 W at 0.7 to 2 W/min. As a result, a carbon film was obtained whose Vickers hardness was gradually increased from 2200 Kg/mm$^2$ at the contiguous surface of the substrate to 4000 Kg/mm$^2$ at the external surface of the carbon film.

When the substrate to be coated was subjected, in advance of carbon deposition, to a plasma of hydrogen at 1 to 10 Torr in order to eliminate impurities such as carbon compounds or nitrogen compounds from the surface to be coated, the contact between the carbon coating and the underlying substrate was further improved. The plasma pressure is selected not lower than 10$^{-3}$ Torr, preferably in a range of 0.01 to 200 Torr. The hydrogon plasma was excited by a high frequency electric power of 0.1 to 100 MHz, or microwaves of 1 to 10 GHz at 10 to 1000 W.

While a description has been made for several embodiments, the present invention should be limited only by the appended claims and should not be limited by the particular examples, and there may be caused to artisan some modifications and variation according to the invention. For example, it has been proved effective to add hydrogen, a halogen, boron, nitrogen, phosphorus or the like into the carbon coating. Preferably, the proportion of hydrogen or a halogen is not higher than 25 atomic % and the proportion of the other additives are not higher than 5%. Also, though the experiments were carried out for depositing carbon coatings on semiconductor substrates, the carbon coatings can be deposited on a substrate made of an organic resin such as PET (polyethylenetelephtalete), PES, PMMA, teflon, epoxy and polyimides, metalic meshs, papers, glass, metals, ceramics and others.

The types of carbon coatings deposited in accordance with the present invention includes amorphous, polycrystals (comprising diamond powders), diamond films. In the case of a dual film, lower and upper films may be, respectively, amorphous and amorphous (having different hardnesses), amorphous and polycrystals, polycrystals and polycrystals, or polycrystals and a diamond film.

I claim:

1. A method for forming an amorphous carbon coating comprising the steps of:
   placing an object in a reaction chamber;
   introducing a reaction gas comprising carbon into said reaction chamber;
   inputting an rf power to a pair of electrodes in order to decompose said reaction gas wherein said object is placed on one of said electrodes;
   inputting a DC bias voltage to at least one of said pair of electrodes; and
   depositing said amorphous coating on said object, wherein said DC bias voltage is continuously changed in order that the hardness of said amorphous coating continuously changes with respect to the thickness of the coating.

2. The method of claim 1 wherein the energy supply to said electrodes is adjusted so that the differential potential between said electrodes on the average increases from the initial stage of the deposition to the final stage of the deposition.

3. The method of claim 2 wherein the average potential of said object is lower than that of the other electrode.

4. The method of claim 3 wherein said differential gradually increases in steps in order that said carbon coating comprises a lower film having a relatively low hardness and a upper film having a relatively high hardness.

5. The method of claim 3 wherein said differential potential is gradually increased in order to form a carbon coating whose hardness is continuously increased from the interface between said carbon coating and said substrate to the external surface of said carbon coating.

6. The method of claim 2 wherein said differential potential is increased by decreasing the pressure in said reaction chamber during the deposition step.

7. The method of claim 6 wherein said pressure is decreased in steps in order that said carbon coating comprises a lower film having a relatively low hardness and an upper film having a relatively high hardness.

8. The method of claim 6 wherein said pressure is gradually decreased in order to form a carbon coating whose hardness is continuously increased from the interface between said carbon coating and said substrate to the external surface of said carbon coating.

9. The method of claim 2 wherein said differential potential is increased by increasing the input level of said electric energy supplied to said electrodes.

10. The method of claim 1 wherein the proportion of the carbon bonds based on the $SP^2$ orbital is continuously reduced with respect to the thickness of the coating in accordance with the increase of said DC bias voltage.

* * * * *